(12) United States Patent
Baldwin et al.

(10) Patent No.: US 8,632,958 B2
(45) Date of Patent: Jan. 21, 2014

(54) METHOD OF CONTROLLING SURFACE ROUGHNESS OF A FLEXOGRAPHIC PRINTING PLATE

(76) Inventors: Kyle P. Baldwin, Acworth, GA (US); Ryan W. Vest, Cumming, GA (US)

( * ) Notice: Subject to any disclaimer, the term of this patent is extended or adjusted under 35 U.S.C. 154(b) by 119 days.

(21) Appl. No.: 13/182,533

(22) Filed: Jul. 14, 2011

(65) Prior Publication Data

US 2013/0017502 A1    Jan. 17, 2013

(51) Int. Cl.
*B41N 1/00* (2006.01)
*G03F 7/00* (2006.01)
*G03F 7/26* (2006.01)

(52) U.S. Cl.
USPC ........ 430/306; 430/270.1; 430/309; 430/329; 430/330; 101/395

(58) Field of Classification Search
USPC ........................................ 428/195.1; 430/306
See application file for complete search history.

(56) References Cited

U.S. PATENT DOCUMENTS

| | | | |
|---|---|---|---|
| 3,264,103 | A | 8/1966 | Cohen et al. |
| 5,175,072 | A | 12/1992 | Martens |
| 5,279,697 | A | 1/1994 | Peterson et al. |
| 6,521,312 | B1 | 2/2003 | Keiser |
| 6,773,859 | B2 | 8/2004 | Fan et al. |
| 7,122,295 | B2 | 10/2006 | Mengel et al. |
| 7,241,124 | B2 | 7/2007 | Roberts et al. |
| 7,329,438 | B2 | 2/2008 | Frazzitta et al. |
| 7,358,026 | B2 * | 4/2008 | Dudek et al. .................. 430/254 |
| 2005/0211120 | A1 * | 9/2005 | Markhart .................... 101/401.1 |
| 2006/0063109 | A1 * | 3/2006 | Choi et al. ..................... 430/300 |
| 2006/0105109 | A1 * | 5/2006 | Gotsick et al. ................ 427/356 |
| 2007/0041741 | A1 * | 2/2007 | Roberts et al. .................. 399/55 |
| 2007/0084368 | A1 * | 4/2007 | Vest et al. ..................... 101/395 |
| 2008/0305407 | A1 * | 12/2008 | Zwadlo et al. ..................... 430/5 |
| 2010/0024672 | A1 | 2/2010 | Vest et al. |
| 2010/0112484 | A1 | 5/2010 | Kato et al. |
| 2010/0167209 | A1 * | 7/2010 | Zwadlo et al. ................ 430/306 |
| 2010/0173135 | A1 * | 7/2010 | Choi et al. ................. 428/195.1 |
| 2010/0242761 | A1 * | 9/2010 | Hackler et al. ............. 101/401.1 |
| 2011/0079158 | A1 * | 4/2011 | Recchia et al. ............... 101/395 |

FOREIGN PATENT DOCUMENTS

| | | |
|---|---|---|
| EP | 1 239 329 | 9/2002 |
| WO | 01/88615 | 11/2001 |
| WO | 01/18604 | 3/2011 |

* cited by examiner

*Primary Examiner* — Chanceity Robinson
(74) *Attorney, Agent, or Firm* — Carmody & Torrance LLP

(57) ABSTRACT

A method of controlling surface roughness of the relief surface of a flexographic printing element during thermal processing is provided. An imaged and exposed relief image printing element is thermally developed to remove the portions of at least one layer of photopolymer that are not crosslinked and cured by a) heating the at least one layer of photopolymer to soften uncured portions of the at least one layer of photopolymer; b) causing contact between the at least one layer of photopolymer and a blotting material; and c) separating the blotting material from the at least one layer of photopolymer. Thereafter, a smooth material is inserted between the surface of the at least one layer of photopolymer and the blotting material. In the alternative, a polymeric film is laminated onto the relief image printing element using heat and pressure.

18 Claims, No Drawings

METHOD OF CONTROLLING SURFACE ROUGHNESS OF A FLEXOGRAPHIC PRINTING PLATE

FIELD OF THE INVENTION

The present invention relates to a method of minimizing surface roughness of thermally developed relief image printing elements.

BACKGROUND OF THE INVENTION

Flexography is a method of printing that is commonly used for high-volume runs. Flexography is employed for printing on a variety of substrates, including, for example, paper, paperboard stock, corrugated board, films, foils and laminates. Coarse surfaces and stretch films, such as newspapers and grocery bags, can be economically printed by means of flexography.

Flexographic printing elements comprise relief image elements raised above open areas. Such printing elements offer a number of advantages to the printer, based chiefly on their durability and the ease with which they can be made. A typical flexographic printing element as delivered by its manufacturer, is a multilayered article and may include a backing or support layer, one or more unexposed photopolymer layers, a protective layer or slip film, and a cover sheet. As described herein the term "flexographic printing element" encompasses structures in any form suitable for printing, including, but not limited to flat sheets, plates, seamless continuous forms and, cylindrical forms.

Optionally, the element can include an adhesive layer between the support and the photopolymerizable layer, or a surface of the support that is adjacent to the layer of photopolymer has an adhesion-promoting surface. In addition, in some embodiments, the flexographic printing element may include an actinic radiation opaque layer for forming an in-situ mask on the element. If used, the actinic radiation opaque layer may substantially cover the surface or only cover an imageable portion of the layer of photopolymer. The actinic radiation opaque layer is also substantially opaque to actinic radiation that corresponds with the sensitivity of the photopolymer.

The flexographic printing element may further include one or more additional layers on or adjacent to the layer of photopolymer. Examples of additional layers include, but are not limited to capping layers, elastomeric layers, release layers, barrier layers, and combinations thereof.

A flexographic printing element is produced by imaging the flexographic printing element to produce a relief image on a surface thereof, which is generally accomplished by selectively exposing the layer or layers of photopolymer to actinic radiation. The flexographic printing element is selectively exposed to actinic radiation in various ways to selectively cure portions of the layer or layers of photopolymer.

Following overall exposure to actinic radiation, the flexographic printing element is "developed" to remove unpolymerized areas of the layer of photopolymer and thereby form a relief image. The developing step removes portions of the at least one layer of photopolymer in the areas which were not exposed to actinic radiation, i.e., the unexposed areas or uncured areas of the layer of photopolymer. The development step may be accomplished, for example, by using a solvent to wash away uncured photopolymer (i.e., "solvent development") or by softening the uncured photopolymer using heat to so that it may be removed (i.e., "thermal development").

It is highly desirable in the flexographic prepress printing industry to eliminate the need for chemical processing of printing elements in developing relief images, in order to go from plate to press more quickly. Processes have been developed whereby flexographic relief image printing elements are prepared from flexographic printing elements using heat. The basic parameters of this process are known, as described in U.S. Pat. Nos. 7,241,124, 7,122,295, 6,773,859, 5,279,697, 5,175,072 and 3,264,103, and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of the process allow for use of the process in the manufacture of flexographic plates for printing newspapers and other publications where quick turn-around times and high productivity are important.

Thermal development of the imaged and exposed flexographic printing element involves heating the flexographic printing element having at least one layer of photopolymer to a temperature sufficient to cause the uncured portions of the layer of photopolymer to liquefy, i.e., soften or melt or flow, and removing the uncured portions. The at least one layer of photopolymer is capable of partially liquefying upon thermal development. That is, during thermal development the uncured layer of photopolymer must soften or melt at a reasonable processing or developing temperature. The polymerized areas (cured portions) of the at least one layer of photopolymer have a higher melting temperature than the polymerized areas (uncured portions) and therefore do not melt, soften, or flow at the thermal development temperatures. The uncured portions can then be removed from the cured portions of the layer of photopolymer by contacting with an absorbent blotting material.

The composition of the photopolymer is such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) melts or substantially softens while the cured photopolymer remains solid and intact at the temperature chosen. Thus the difference in melt temperature allows the uncured photopolymer to be selectively removed thereby creating a relief image.

During the thermal developing step, the at least one layer of photopolymer is heated by conduction, convection, radiation, or other heating methods to a temperature sufficient to effect melting of the uncured portions but not so high as to effect distortion of the cured portions of the layer. Typically, the printing element is heated to a surface temperature above about 40° C., typically from about 40° C. to about 230° C. in order to effect melting or flowing of the uncured portions of the layer of photopolymer. By maintaining more or less intimate contact of the blotting material with the layer of photopolymer that is molten in the uncured regions, a transfer of the uncured photopolymer from the layer of photopolymer to the blotting material takes place. While still in the heated condition, the blotting material is separated from the cured layer of photopolymer in contact with the support layer to reveal the relief structure. A cycle of the steps of heating the at least one layer of photopolymer and contacting the molten (portions) layer with the blotting material can be repeated as many times as necessary to adequately remove the uncured material and create sufficient relief depth, typically about 5 to 15 cycles.

One problem with current blotting techniques is that thermally developed printing plates may be vulnerable to high surface roughness (SR) due to the blotting materials used to remove uncured photopolymer. In addition to removing uncured photopolymer, blotting materials may embed patterns of the blotting material in the cured photopolymer relief. In other words, if the surface roughness of the blotting material is excessive, it may print blotter patterns, especially on the solid areas, leading to inconsistent ink coverage and low solid ink density (SID).

It is also a known problem in flexographic printing, that solid areas (i.e., areas in the image where there are no half tone dots), appear to print with less saturation and somewhat less uniformity than halftone areas representing dark image areas. Thus an area with a dot coverage of 95% to 98% may appear darker than a solid area (100%). A problem in printing solid areas in flexography is uneven ink transfer over the full solid image area, lack of density and a halo effect (i.e., a darker border) along the edges of the solid image area.

The level of color saturation achievable during flexographic printing is dependent upon many factors, prominent among which is the amount and uniformity of ink which can be applied to the print substrate, particularly in solid areas. This is commonly referred to as "Solid Ink Density" (SID). SID is sometimes higher at tone levels less than 100%, e.g., the optical print density achieved at the 97% tone level is slightly higher than that achieved at a 100% (solid) tone.

Therefore, it is desirable to provide improved methods of controlling and/or minimizing the surface roughness of thermally developed relief image printing elements as well as increasing the achievable solid ink density on solid areas of relief image printing elements.

SUMMARY OF THE INVENTION

It is an object of the present invention to minimize surface roughness on a relief surface of a relief image printing element.

It is another object of the present invention to control the surface roughness of a relief surface of a relief image printing element during thermal processing or development.

It is still another object of the present invention to reduce the surface roughness of a relief surface of a relief image printing element that has been thermally processed or developed.

It is still another object of the present invention to improve the achievable solid ink density of solid areas on the relief image printing element.

To that end, the present invention relates generally to a method of controlling surface roughness on a surface of a relief image printing element, wherein the relief image printing element comprises at least one layer of photopolymer that has been selectively imagewise exposed to actinic radiation to selectively crosslink and cure portions of the at least one layer of photopolymer, wherein the portions of the at least one layer of photopolymer that are crosslinked and cured form the relief image and the portions of the at least one layer of photopolymer that are not crosslinked or cured are removable in a development step, the method comprising the steps of:
 a) thermally developing the relief image printing element to remove the portions of the at least one layer of photopolymer that are not crosslinked and cured by:
  i) heating the at least one layer of photopolymer to a sufficient temperature to soften uncured portions of the at least one layer of photopolymer;
  ii) causing contact between the at least one layer of photopolymer and a blotting material, wherein when the blotting material contacts the at least one layer of photopolymer, the softened uncured photopolymer portions of the at least one layer of photopolymer are absorbed into the blotting material; and
  iii) separating the blotting material from the at least one layer of photopolymer;
 b) contacting the at least one layer of photopolymer with a smooth material while pressure and heat are applied to the smooth material in forcing it into contact with the at least one layer of photopolymer;
 c) separating the smooth material from the at least one layer of photopolymer;
 wherein average surface roughness of the surface of the relief image printing element is reduced in relation to a printing element processed without steps (b) and (c).

The present invention also relates generally to a method of reducing surface roughness on a surface of a relief image printing element, wherein the relief image printing element comprises at least one layer of photopolymer that has been selectively imaged and exposed to actinic radiation to create a relief image; wherein the relief image printing element is thermally processed to removed uncured photopolymer and reveal the relief image; the method comprising the steps of:
 a) thermally developing the relief image printing element to remove the portions of the at least one layer of photopolymer that are not crosslinked or cured by:
  i) heating the at least one layer of photopolymer to a sufficient temperature to soften uncured portions of the at least one layer of photopolymer;
  ii) causing contact between the at least one layer of photopolymer and a blotting material, wherein when the blotting material contacts the at least one layer of photopolymer, the softened uncured photopolymer portions of the at least one layer of photopolymer are absorbed into the blotting material; and
  iii) separating the blotting material from the at least one layer of photopolymer;
 b) laminating a polymeric film onto the at least one layer of photopolymer of the relief image printing element using heat and pressure; and
 c) separating the polymeric film from the relief image printing element;
 wherein average surface roughness of the relief surface of the relief image printing element is reduced in relation to a printing element processed without steps (b) and (c).

DETAILED DESCRIPTION OF THE PREFERRED EMBODIMENTS

The present invention relates to a method of minimizing surface roughness on relief surfaces of flexographic printing elements. While slight surface roughness can be conducive to increasing the optical density, if the surface roughness is too excessive, the optical density is decreased due to failure to make intimate contact between the printing plate surface and a given substrate.

"Surface roughness" or "surface texture" of the printing plate can be defined in reference to certain parameters and one of the most common parameters for surface texture is Average Roughness (Ra). Ra can be determined using ASTM standard ASME B46.1. Ra is calculated by an algorithm that measures the average length between the peaks and valleys and the deviation from the mean line on the entire surface within the sampling length. Ra averages all peaks and valleys of the roughness profile and then neutralizes the few outlying points so that the extreme points have no significant impact on the final results, and provides a simple and effective method for monitoring surface texture and ensuring consistency in measurement of multiple surfaces.

In a preferred embodiment, the average surface roughness (Ra) is controlled to less than about 1,000 nm upon thermal processing, more preferably, the average surface roughness is controlled to less than about 800 nm, and most preferably, the average surface roughness is controlled to less than about 500 nm.

In addition, it is also desirable to have high ink transfer to increase optical density upon printing. Proper control of the amount of ink applied to a printing substrate is one of the most important factors for success in printing halftone and process color work. It allows control of the hue of secondary colors, dot gain, trapping, ink consumption and various other factors important to both quality of cost.

Density is the ability of a material to absorb light. Generally, the darker a process color is to the eye, the higher the density. Density measurements of solid ink patches are used to monitor the ink film thickness applied during a press run. In comparing two printed sheets, density readings should be within 0.05 units, when measured on a densitometer, for meaningful print quality assessment not gain, print contrast and apparent trap are directly affected by this solid, ink density. Generally, these values will vary as the solid ink density changes. Therefore, monitoring solid ink density during a press run is essential when comparing any printed material in terms of quality.

In a preferred embodiment, it is desirable that that printing elements processed in accordance with the present invention have an achievable solid ink density be greater than about 1.30, more preferably an achievable solid ink density of greater than about 1.40. In contrast, the inventors have determined that a typical achievable solid ink density of a printing element not processed in accordance with the present invention is about 1.20. Thus, the use of the smooth material as described herein produces printing elements having a significant improvement in the achievable solid ink density as compared to printing elements that are simply thermally processed.

When it comes to surface roughness of thermally processed plates, the following factors have been considered to be important: (1) squeeze types; (2) hot roll temperature; (3) IR laser power; (4) forward exposure times, (5) blotter types; and (6) type of photoresin. As described herein, the inventors of the present invention have determined that it is also possible to control the surface roughness during the thermal development process by use of a smooth material in the thermal development process.

The inventors have determined that excess surface roughness on thermally processed printing elements results at least in part from the last pass of the blotter material over the photosensitive printing element. Based thereon, the inventors of the present invention have found that the blotter pattern, can be altered so long as a subsequent final pass, or passes, is utilized between the thermal development step and the post cure and/or detack processing step(s).

In a first preferred embodiment, the present invention relates generally to a method of reducing surface roughness on a surface of a relief image printing element, wherein the relief image printing element comprises at least one layer of photopolymer that has been selectively imagewise exposed to actinic radiation to selectively crosslink and cure portions of the at least one layer of photopolymer, wherein the portions of the at least one layer of photopolymer that are crosslinked and cured form the relief image and the portions of the at least one layer of photopolymer that are not crosslinked or cured are removable in a subsequent development step, the method comprising the steps of:

a) thermally developing the relief image printing element to remove the portions of the at least one layer of photopolymer that are not crosslinked or cured by:
  i) heating the at least one layer of photopolymer to a sufficient temperature to soften uncured portions of the at least one layer of photopolymer;
  ii) causing contact between the at least one layer of photopolymer and a blotting material, wherein when the blotting material contacts the at least one layer of photopolymer, the softened uncured photopolymer portions of the at least one layer of photopolymer are absorbed into the blotting material; and
  iii) separating the blotting material from the at least one layer of photopolymer;
b) contacting the at least one layer of photopolymer with a smooth material while pressure and heat are applied to the smooth material in forcing it into contact with the at least one layer of photopolymer;
wherein average surface roughness of the surface of the relief image printing element is reduced in relation to a printing element processed without step (b).

As described herein, the inventors of the present invention have determined that if a smooth material is placed between the plate surface and the blotting material during the final pass of the blotting material over the photosensitive printing element, a smoother surface having a much lower Ra is achievable on the plate.

The smooth material is preferably a polymeric material (e.g., polyester, polyethylene, or polypropylene or other smooth polymer film and optionally, but preferably, further comprises a release coating thereon. In one embodiment, the smooth material comprises a polyethylene terephthalate film having a silicone release coating. As used herein, a smooth material is a material that has an Ra of less than 1000 nm, more preferably less than 800 nm and most preferably less than 500 nm. The smooth material should be a flexible sheet.

In one embodiment, the thermal processing unit can be set for at least three additional passes at a temperature of between about 140 to 160° C., more preferably for five additional passes at a temperature of 150° C. using the smooth polymeric material. It was observed that these settings resulted in a reduction in roughness from an Ra value of about 2000 nm down to an Ra value of about 800 nm.

In another preferred embodiment, the present invention relates generally to a method of reducing surface roughness on a surface of a relief image printing element, wherein the relief image printing element comprises at least one layer of photopolymer that has been selectively imaged and exposed to actinic radiation to create a relief image; wherein the relief image printing element is thermally processed to removed uncured photopolymer and reveal the relief image; the method comprising the steps of:

a) thermally developing the relief image printing element to remove the portions of the at least one layer of photopolymer that are not crosslinked or cured by:
  i) heating the at least one layer of photopolymer to a sufficient temperature to soften uncured portions of the at least one layer of photopolymer;
  ii) causing contact between the at least one layer of photopolymer and a blotting material, wherein when the blotting material contacts the at least one layer of photopolymer, the softened uncured photopolymer portions of the at least one layer of photopolymer are absorbed into the blotting material; and
  iii) separating the blotting material from the at least one layer of photopolymer;

b) laminating a polymeric film onto the at least one layer of photopolymer of the relief image printing element using heat and pressure; and c) separating the polymeric film from the relief image printing element;

wherein average surface roughness of a relief surface of the relief image printing element is reduced in relation to a printing element processed without steps (b) and (c).

In this embodiment, a post lamination step is used in which the thermally developed relief image printing element is sent through a laminator with a smooth polymeric film. One suitable polymeric film is a polyethylene terephthalate film with a silicone release coating. The thermally developed relief image printing element and the smooth polymeric film are sent through the laminator at a speed of 1 foot per minute and a temperature of between about 110-130° C., more preferably a temperature of 120° C. it was observed that this lamination step resulted in a decrease in surface roughness of from about an Ra value of about 1800 nm down to an Ra value of about 800 nm with only a single pass. The laminated polymeric film is then removed from the relief image printing element prior to printing commencing.

As described herein, the thermal development step comprises heating the at least one layer of photopolymer to soften uncured portions of the at least one layer of photopolymer, causing contact between the at least one layer of photopolymer and a blotting material, wherein the blotting material removes the softened uncured portions of the at least one layer of photopolymer, and then separating the blotting material from the at least one layer of photopolymer.

The at least one layer of photopolymer is typically heated to and maintained at a temperature of between about 40 and about 230° C., more preferably between about 140 and about 180° C., and most preferably at a temperature of between about 170 and 180° C. during the thermal development step.

The blotting material preferably comprises paper or woven or non-woven fabrics. The absorbent blotting material is typically selected from non-woven materials, paper stocks, screen mesh, fibrous woven material, open-celled foam materials and porous materials. Other similar blotting materials would also be known to those skilled in the art and would be usable in the present invention. The blotting material is selected to have a melt temperature exceeding the melt or softening or liquefying temperature of the unirradiated or uncured portions of the photopolymer. The absorbent blotting material should also possess a high absorbency for the molten photopolymer.

As discussed above, blotting materials can have an effect on relief. For example, Cerex® 23, a spun bonded nylon 6,6 non-woven material (available from Cerex America, Inc) and other similar blotting materials are more efficient in removing uncured photoresin than Ahlstrom® 100% cotton blotting papers (available from Ahlstrom, Inc.) and other similar blotting materials while Ahlstrom® gives lower surface roughness than Cerex®.

The printing elements may subsequently be subjected to various finishing steps. For example, the print surface can be stabilized by post-exposure of the thermally treated photopolymerizable element to actinic radiation. Post-exposure of the photopolymerizable element is an overall exposure to actinic radiation to ensure that the photopolymerization process is complete and that the so formed flexographic printing plate will remain stable during printing and storage. This post-exposure step can utilize the same radiation source as the imagewise main exposure. In one embodiment, the print surface may be finished using a five-minute pose exposure to actinic radiation.

Furthermore, if the surface of the flexographic printing plate is still tacky, detackification treatments may be applied for a sufficient period of time. For example, tackiness can be eliminated by a treatment of the flexographic printing plate with bromine or chlorine solutions or may be accomplished by exposure to UV radiation sources having a wavelength not longer than 300 nm, as described, for example, in U.S. Pat. No. 4,806,506.

Finally, it is contemplated that the use of a smooth material during thermal development can be achieved by incorporating a smooth surface into the thermal processor design. For example, the thermal processor can be designed so that the smooth surface is configured to make contact with the relief image instead of the blotting material for the final pass(es) to increase the achievable solid ink density and reduce the average of the relief image printing elements.

It is also to be understood that the following claims are intended to cover all of the generic and specific features of the invention described herein and all statements of the scope of the invention which as a matter of language might fall therebetween.

What is claimed is:

1. A method of reducing surface roughness on a surface of a relief image printing element, wherein the relief image printing element comprises at least one layer of photopolymer that has been selectively imagewise exposed to actinic radiation to selectively crosslink and cure portions of the at least one layer of photopolymer, wherein the portions of the at least one layer of photopolymer that are crosslinked and cured form the relief image and the portions of the at least one layer of photopolymer that are not crosslinked and cured are removable in a subsequent development step, the method comprising in order the steps of:

a) thermally developing the relief image printing element to remove the portions of the at least one layer of photopolymer that are not crosslinked and cured by:

i) heating the at least one layer of photopolymer to a sufficient temperature to soften uncured portions of the at least one layer of photopolymer;

ii) causing contact between the at least one layer of photopolymer and a web of blotting material, wherein the web of blotting material is looped under and around at least a portion of a heated roller that contacts the at least one layer of photopolymer, wherein when the web of blotting material contacts the at least one layer of photopolymer, the softened uncured photopolymer portions of the at least one layer of photopolymer are absorbed into the blotting material; and iii) separating the blotting material from the at least one layer of photopolymer; and thereafter b) contacting the at least one layer of photopolymer with a smooth material while pressure and heat are applied to the smooth material in forcing it into contact with the at least one layer of photopolymer; and;

c) separating the smooth material from the at least one layer of photopolymer.

2. The method according to claim 1, wherein the blotting material is an absorbent material selected from the group consisting of paper, woven and non-woven fabrics, screen mesh, open cell foam materials and porous materials.

3. The method according to claim 1, wherein the smooth material comprises a polymeric material selected from the group consisting of polyesters, polyethylene, polypropylene and combinations of the foregoing.

4. The method according to claim 3, wherein the smooth material comprises a release coating thereon.

5. The method according to claim 4, wherein the smooth material comprises a polyethylene terephthalate film with a silicone release coating thereon.

6. The method according to claim 1, wherein the step of heating the at least one layer of photopolymer to a sufficient temperature to soften uncured portions of the at least one layer of photopolymer comprises heating the layer of photopolymer to a temperature of between about 40 and about 230° C.

7. The method according to claim 1, wherein step a) is repeated between about 5 and about 15 times.

8. The method according to claim 1, wherein an average surface roughness of the relief image printing element is controlled to less than about 1000 nm.

9. The method according to claim 8, wherein the average surface roughness of the relief image printing element is controlled to less than about 500 nm.

10. The method according to claim 1, wherein steps b) and c) are repeated at least three times and step b) is conducted at a temperature of between about 140 to about 160° C.

11. The method according to claim 10, wherein steps b) and c) are repeated five times and step b) is conducted at a temperature of about 150° C.

12. A method of reducing surface roughness on a surface of a relief image printing element, wherein the relief image printing element comprises at least one layer of photopolymer that has been selectively imaged and exposed to actinic radiation to create a relief image comprising cured portions of the at least one layer of photopolymer; wherein the imaged and exposed relief image printing element is thereafter thermally processed to removed uncured portions of the at least one layer of photopolymer and reveal the relief image; the method comprising in order the steps of:
   a) thermally developing the relief image printing element to remove the portions of the at least one layer of photopolymer that are not crosslinked and cured by:
      i) heating the at least one layer of photopolymer to a sufficient temperature to soften uncured portions of the at least one layer of photopolymer;
      ii) causing contact between the at least one layer of photopolymer and a web of blotting material, wherein the web of blotting material is looped under and around at least a portion of a heated roller that contacts the at least one layer of photopolymer, wherein when the web of blotting material contacts the at least one layer of photopolymer, the softened uncured photopolymer portions of the at least one layer of photopolymer are absorbed into the blotting material;
      iii) separating the blotting material from the at least one layer of photopolymer; and thereafter
   b) laminating a polymeric film onto the at least one layer of photopolymer of the relief image printing element using heat and pressure; and
   c) separating the polymeric film from the relief image printing element.

13. The method according to claim 12, wherein the polymeric film is selected from the group consisting of polyesters, polyethylene, polypropylene and combinations of the foregoing.

14. The method according to claim 13, wherein the polymeric film comprises a release coating thereon.

15. The method according to claim 14, wherein the polymeric film comprises a polyethylene terephthalate film with a silicone release coating thereon.

16. The method according to claim 12, wherein the laminating step is performed by passing the relief image printing element with the polymeric film thereon through a laminator at a speed of about one foot per minute and a temperature of about 110-130° C.

17. The method according to claim 12, wherein an average surface roughness of the relief image printing element is controlled to less than about 1000 nm.

18. The method according to claim 17, wherein the average surface roughness of the relief image printing element is controlled to less than about 500 nm.

* * * * *